(12) United States Patent
Dujardin et al.

(10) Patent No.: US 6,274,234 B1
(45) Date of Patent: Aug. 14, 2001

(54) VERY LONG AND HIGHLY STABLE ATOMIC WIRES, METHOD FOR MAKING THESE WIRES, APPLICATION IN NANO-ELECTRONICS

(75) Inventors: Gérald Dujardin, Châtenay-Malabry; Andrew Mayne, Antony; Fabrice Semond, Monguis-le-Haut; Patrick Soukiassian, St. Remy les Chevreuse, all of (FR)

(73) Assignees: Commissariat a l'Energie Atomique; Centre National de la Recherche Scientifique, both of (FR)

( * ) Notice: Subject to any disclaimer, the term of this patent is extended or adjusted under 35 U.S.C. 154(b) by 0 days.

(21) Appl. No.: 09/319,977
(22) PCT Filed: Dec. 15, 1997
(86) PCT No.: PCT/FR97/02298
 § 371 Date: Jun. 14, 1999
 § 102(e) Date: Jun. 14, 1999
(87) PCT Pub. No.: WO98/27578
 PCT Pub. Date: Jun. 25, 1998

(30) Foreign Application Priority Data

Dec. 16, 1996 (FR) .................................................. 96 15435

(51) Int. Cl.⁷ .................................................... H01L 21/04
(52) U.S. Cl. ............................ 428/336; 357/77; 427/255; 428/209; 428/446; 428/472; 428/698; 438/663; 438/674; 438/680; 438/684
(58) Field of Search .................................... 428/446, 209, 428/698, 472, 469, 457, 336; 257/77; 438/684, 674, 663, 680; 427/255

(56) References Cited

U.S. PATENT DOCUMENTS

| | | | |
|---|---|---|---|
| 5,145,741 | * | 9/1992 | Quick .................................... 428/698 |
| 5,296,258 | * | 3/1994 | Tay et al. ............................... 427/96 |
| 5,318,915 | * | 6/1994 | Baliga et al. ........................... 437/24 |
| 5,363,800 | | 11/1994 | Larkin et al. .......................... 117/95 |
| 5,391,841 | * | 2/1995 | Quick .................................... 174/258 |
| 5,442,200 | * | 8/1995 | Tischler ................................. 257/77 |
| 5,466,617 | * | 11/1995 | Shannon ................................. 437/40 |
| 5,709,745 | * | 1/1998 | Larkin et al. .......................... 117/96 |

OTHER PUBLICATIONS

"Building one–amd two–dimensional nanostructures by diffusion–controlled aggregation at surfaces" Roder et al Nature; vol. 366; Nov. 11, 1993; pp. 141–143.

Anisotropy in Nucleation and Growth of Two–Dimensional Islands during Homoepitaxy on "Hex" Reconstructed Au(100); Gunther et al Physical Review Letters; vol. 73, No. 4; Jul. 25, 1994; pp. 553–556.

"Structures of Low–coverage Phases of Al on the Si(100) Surface Observed by Scanning Tunneling Microscopy" Itoh et al Physical Review; vol. 48, No. 19; Nov. 15, 1993; pp. 14 663–14 666.

"Behavior of Tellurium on Silicon (100)" Yoshikawa et al. Surface Science 321; (1994); pp. L183–L188.

(List continued on next page.)

*Primary Examiner*—Archene Turner
(74) *Attorney, Agent, or Firm*—Hayes, Soloway, Hennessey, Grossman & Hage, PC

(57) ABSTRACT

Atomic wires of great length and great stability are formed on the surface of a SiC substrate as straight chains of dimers of an element chosen from amongst SiC and C. In order to produce same, layers of the element are formed on the surface and the assembly is constructed by means of annealings of the surface provided with the layers. The resulting wires have application to nanoelectronics.

14 Claims, 3 Drawing Sheets

OTHER PUBLICATIONS

Surface Self–Diffusion of Si on Si(001); Mo et al Surface Science 268; (1992); pp. 275–295.

"Atomic–Scale Desorption Through Electronic and Vibrational Excitation Mechanisms" Shen et al Science; vol. 268; Jun. 16, 1995; pp. 1590–1592.

"Surface Structure and Metallization of SiC"Kaplan et al Properties of Silicon Carbide; vol. 13; (1995); pp. 101–120.

Atomic Structure of the B–SiC(100)–3x2) Surface: Soukiassian et al Physical Review Letters; vol. 77. No. 10; Sep. 2, 1996; pp. 2013–2016.

"Promotion of the Osidation of Silicon Carbide by a Rubidium Overlayer" Riehl–Chudoba et al: J. Appl. Phys. 76 (3); Aug. 1, 1994; pp. 1932–1934.

"Rb/B–SiC(100) Surface and Catalytic Oxidation of the Substrate" Riehl–Chudoba et al Surface Science 331; (1995) pp. 625–630.

"Direct and Rb–Promoted $SiO_x$/B–SiC(100) Interface Formation" Riehl–Chudoba et al Physical Review; vol. 51, No, 20; May 15, 1995; pp. 14 300–14 310.

* cited by examiner

VERY LONG AND HIGHLY STABLE ATOMIC WIRES, METHOD FOR MAKING THESE WIRES, APPLICATION IN NANO-ELECTRONICS

TECHNICAL FIELD

The present invention concerns atomic wires of great length and great stability as well as a method of manufacturing these wires.

The invention applies particularly to the field of nano-electronics, optics and micromechanics.

PRIOR ART

Various works have been devoted to the manufacture of atomic wires on metal surfaces or semiconductor surfaces.

The formation of atomic wires results from processes bringing into play the structural, dynamic and reactivity properties of solid surfaces on an atomic scale.

The problem of manufacturing atomic wires is also closely linked to that of the display of these wires formed by atoms.

Because of their sub-nanometric dimensions (less than or equal to 1 nm), the display and inspection of such nano-structures can be achieved only by means of a tunnel-effect microscope.

The main known methods of manufacturing atomic wires are indicated below.

A first known method consists of a controlled deposition of adsorbate on a solid surface.

According to this first known method, by using the anisotropic properties of the solid surfaces and controlling the flow of the adsorbate deposition and the temperature of the substrate, it is possible to construct atomic wires.

The formation of these wires is based either on surface anisotropic bonding coefficients, or on the anisotropy of certain metastable structures, or on an-isotropic diffusion.

In this regard, documents (1) to (5) should be consulted, which, like the other documents cited afterwards, are mentioned at the end of the present description.

A second known method consists of nanolithography with the tip of a tunnel-effect microscope.

The electrons issuing from this tip of the tunnel-effect microscope can be used for producing, on a nanometric scale, a decomposition or desorption reaction.

By moving the tip of the tunnel-effect microscope, it is thus possible to produce atomic wires.

In this regard, reference should be made to document (6).

The compared performances of these known methods are indicated below.

The controlled deposition method makes it possible to manufacture atomic wires all having the same direction over a large surface area.

The composition of these wires can be clearly defined.

However, this method has drawbacks.

This is because the wires obtained are thermally unstable, because notably of the substrates or adsorbates employed.

In addition, the length of these atomic wires is generally limited to a few tenths of a nanometer, and their distribution over the surface is random and therefore not controllable.

In addition, it should be noted that, when the density of these wires on the surface is great, a phenomenon of coalescence of the wires may occur, which results no longer in wires but in a bidimensional set of atoms.

The second known method, mentioned above, makes it possible to manufacture a highly regular lattice of atomic wires.

The length of these wires can, potentially, be high.

However, this second known method has the following drawbacks.

The atomic wires are of poor quality on an atomic scale.

In addition, only a small number of wires can be obtained by this method.

Moreover, this method generally requires a surface at low temperature, below 0° C.

DISCLOSURE OF THE INVENTION

The aim of the present invention is to remedy the above drawbacks.

Its object is first of all atomic wires of great length and great stability.

The invention also concerns a method of manufacturing these wires.

This method is the only one which makes it possible to produce a regular lattice of atomic wires of great length over a large surface area.

In addition, the atomic wires manufactured by virtue of this method all have very high thermal stability, up to a temperature of around 1000° C.; there is no comparison with the thermal stability of the atomic wires obtained with the other known methods, which is around 200° C. in the best cases.

The invention therefore considerably pushes back the limits of stability known at the present time for this type of sub-nanostructure.

Moreover, unlike the known method mentioned above, the method which is the object of the invention makes it possible to control the number of atomic lines or wires by making it possible to obtain assemblies ranging from a super-lattice of atomic wires to an assembly limited to a single atomic wire on a surface.

In precise terms, the object of the present invention is a set of N atomic wires, N being an integer number equal to at least 1, characterised in that these wires are formed on the surface of an SiC substrate and are rectilinear chains of dimers of an element chosen from amongst Si and C, these chains being parallel to each other and substantially equidistant from each other, extending from one end of the substrate to the other and being perpendicular to the direction of the dimers.

According to a first particular embodiment of this assembly, the said surface is a surface of Si-terminated β-SiC (100), the said chains being chains of Si—Si dimers.

According to a second particular embodiment, the said surface is a surface of C-terminated β-SiC (100), the said chains being chains of C—C dimers.

The present invention also concerns a method of manufacturing the assembly of N atomic wires which is the object of the invention, characterised in that layers of said element are formed on the said surface, and the said assembly is constructed by means of annealings of this surface provided with the said layers, the last annealing being able to progressively eliminate from this surface, selectively, rows of dimers of the said element so as to obtain the said assembly of N atomic wires.

The temperature and duration of the last of the annealings can be chosen in order to obtain a required number N of atomic wires over a given length, counted perpendicularly to the wires.

Preferably, the said assembly is constructed in a chamber maintained at a pressure below $5 \times 10^{-9}$ Pa or in a neutral atmosphere.

According to a preferred implementation of the method which is the object of the invention, a monocrystalline substrate of SiC is formed in β-SiC cubic phase (100), this substrate is transformed so that its surface is Si terminated and 3×2 reconstructed, and the substrate thus transformed is annealed at a temperature chosen in the range from 1000° C. to 1150° C. so as to progressively eliminate from the surface, by selective desorption, rows of Si—Si dimers and to obtain the said assembly of N atomic wires.

The time during which the substrate thus transformed is annealed depends on the geometric characteristics of the substrate. This time can be chosen in a range from 5 minutes to 10 minutes.

The said monocrystalline substrate can be obtained by chemical vapour deposition of a first gaseous compound containing carbon and a second gaseous compound containing silicon on a vicinal surface of Si (100) de-orientated by 4°.

The first gaseous compound can be $C_3H_6$ and the second gaseous compound can be $SiH_4$.

Preferably the said monocrystalline substrate is annealed so that its surface becomes a surface with a carbon-rich 1×1 structure, layers of silicon are deposited on this surface at room temperature and then the substrate provided with these layers of silicon is annealed at approximately 1000° C. in order to obtain a surface of Si-terminated and 3×2 reconstructed β-SiC (100).

The present invention has many applications.

It can be stated now that it applies to the manufacture of an assembly of wires of a metallic, magnetic, polymeric, organic, semiconducting, insulating or biological material, using the said assembly of N atomic wires as a matrix receiving a deposit of the said material.

The present invention also applies to the parallel addressing of electronic devices whose size is around 0.1 nm to 10 nm, the atomic wires having a thickness of around 0.1 nm to 10 nm.

The atomic wires which are the object of the invention differ from that which has been proposed in the prior art both through the manufacturing method and through the nature of the product obtained.

This is because the choice of the substrate, the method used and the quality of the wires obtained are very different from that which was taught by the prior art.

With regard to the choice of the substrate, the atomic wires obtained are obtained on the surface of a refractory semiconductor material, silicon carbide, preferably in its β-SiC cubic phase.

Silicon carbide is a material having very good characteristics, namely good thermal stability, good chemical stability and an ability to withstand very hostile environments (high temperatures, ionising radiation, aggressive chemical surroundings).

It is also a ceramic which has great hardness (which is close to that of diamond and that of boron carbide).

Finally, it is one of the best biocompatible materials known.

In particular it has been verified that silicon wires manufactured on β-SiC (100) are very stable thermally, up to approximately 1000° C., and chemically.

In the known methods, the substrates used are Si (100) or surfaces of monocrystalline metals such as for example Pt (110) or Au (100).

In all cases the atomic wires are thermally unstable.

In the case of the controlled deposition method, this instability is inherent in the method itself, which is based on the dependency of the surface diffusion on temperature.

In the case of the nanolithographic method with a tunnel-effect microscope, the instability results from the choice of the material (H/Si for example), which is unstable as from a temperature of around 300° C. to 400°0 C.

The methods based on controlling the surface diffusion as a function of temperature only make it possible to produce atomic wires which are stable at only one temperature and which change when the temperature changes.

In the present invention, a method is preferably used based on selective desorption at high temperature, between 1000° C. and 1150° C.

The density of the atomic wires is controlled by controlling the surface temperature.

Once produced, these wires are very stable below 1000° C.

With regard to the quality of the atomic wires obtained, notably on β-SiC (100), it can be stated that these atomic wires have unique characteristics which cannot be obtained by other methods.

The length of these atomic wires is limited only by the substrate on which they are formed.

These atomic wires are all parallel, have good qualities on an atomic scale and can form lattices whose density can be controlled.

These wires are very stable chemically and especially thermally up to approximately 1000° C.

BRIEF DESCRIPTION OF THE DRAWINGS

The present invention will be better understood from a reading of the description of example embodiments given below, purely indicatively and in no way limitatively, with reference to the accompanying drawings, in which.

DETAILED DISCLOSURE OF PARTICULAR EMBODIMENTS

The invention therefore concerns atomic lines or wires of great length, formed on the surface of a silicon carbide substrate.

It is possible to vary the distances between the atomic wires in a controlled fashion, from 1 nm to several millimetres.

Figure 1:
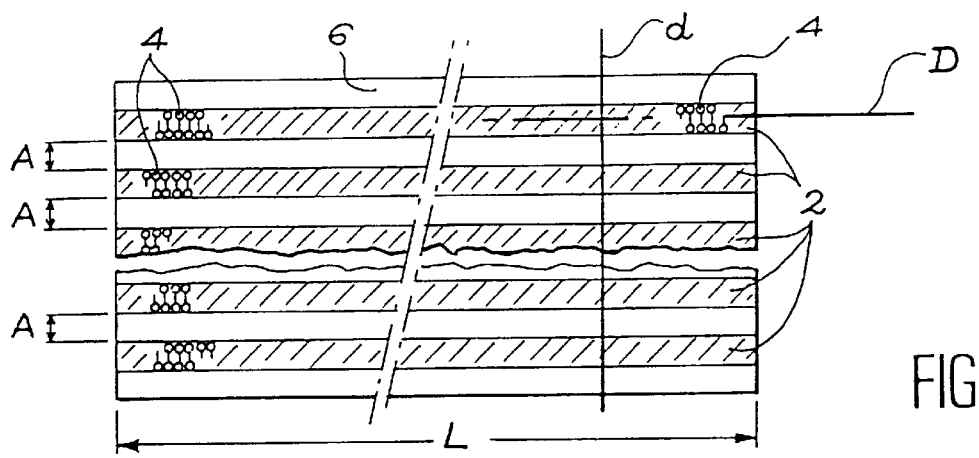
FIG. 1 is a schematic plan view of an assembly of atomic wires according to the invention, of high density (superlattice)
Figure 2:
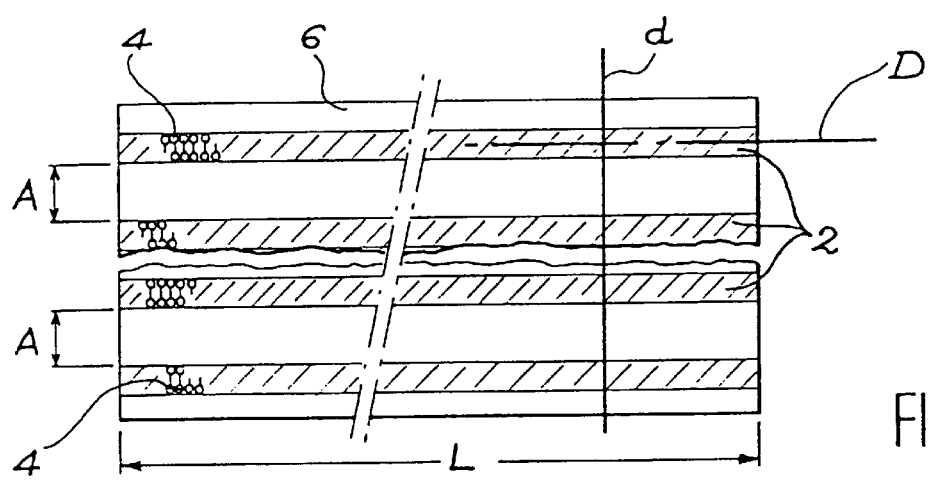
FIG. 2 is a schematic plan view of another assembly of atomic wires according to the invention, with a lower density.
Figure 3:
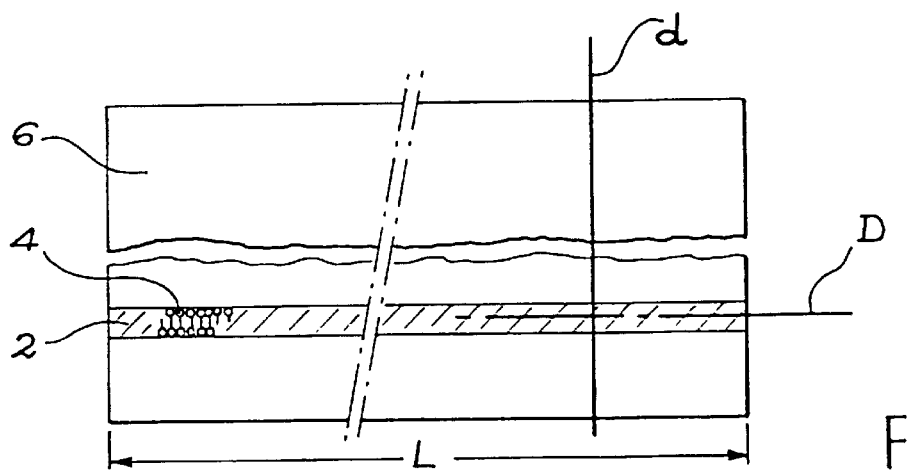
FIG. 3 is a schematic plan view of an isolated atomic wire according to the invention (N=1)

This is illustrated schematically in plan view by FIGS. 1 to 3.

In FIGS. 1 and 2, atomic wires 2 can be seen, which are chains of silicon dimers (Si—Si) referenced 4, are very straight and all have the same direction D.

Their length L is very great (greater than 100 nm) and is limited only by the length of the substrate 6 on which these wires 2 are formed.

These wires are regularly spaced apart from each other.

They extend perpendicularly from the direction d of the dimers.

It is possible to vary the number N of atomic wires with the temperature in order to change from a super-lattice of atomic wires, which are separated from each other by a distance of around a few tenths of a nanometer (FIG. 1), to an assembly of atomic wires which are separated from each other by a distance A of around a few nanometers (FIG. 2) and even change from this assembly to a single isolated atomic wire 2 which is separated from other atomic wires (not shown) by a distance of several tens of a nanometer (FIG. 3).

In FIGS. 1 to 3 the dimers 4 have been depicted and it can be seen clearly that the direction D of the atomic wires is perpendicular to the direction d of these dimers 4, this direction d being given by the straight line which passes through the centers of two silicon atoms belonging to the same dimer.

As seen above, these atomic wires are stable up to a temperature of around 1000° C.

A method of manufacturing silica atomic wires of the type in FIGS. 1 to 3 is explained below.

The starting point is an Si terminated and 3×2 reconstructed β-SiC (100) surface.

The preparation of such a surface is described in documents (7) and (8), to which reference should be made.

Starting from this surface, another surface reconstruction is carried out, c(4×2), by thermal desorption of silicon.

In this regard, document (7) should be consulted.

The states which are of interest in the present invention are those which appear between these two surface reconstructions.

The rows of silicon dimers are eliminated progressively from the 3×2 reconstructed surface, by annealing at temperatures of between 1000° C. and 1150° C. and for variable times ranging from approximately 5 minutes to 10 minutes.

The atomic wires which are the object of the invention appear at the phase transition between the 3×2 reconstruction and the c(4×2) reconstruction.

The number N of atomic wires and the spacing A between them depends on the temperature and duration of this annealing.

The manufacture of the atomic wires is carried out in a sealed chamber (not shown), maintained at a pressure of less than $5 \times 10^{-9}$ Pa.

The silicon carbide substrate used is preferably a very thin monocrystalline film, with a thickness of around 1 μm, of silicon carbide in β-SiC (100) cubic phase.

It is obtained by chemical vapour deposition (or CVD) of $C_3H_8$ and $SiH_4$ on a vicinal surface of Si (100) de-orientated by 4° C.

It is also possible to use, as a substrate, a solid SiC monocrystal.

In this regard, documents (9), (10) and (11) should be consulted.

Next, the monocrystalline substrate of silicon carbide in β-SiC (100) cubic phase is subjected to a succession of annealings which eliminate, from the surface of the substrate, native oxides of silicon and carbon resulting from the CVD manufacturing method, which results in a carbon-rich 1×1 surface structure.

Next, layers (at least two) of silicon are deposited successively at room temperature (around 20° C.) on this surface.

Then annealings of the resulting substrate are carried out at approximately 1000° C.

This results in a plane surface of β-SiC (100) which is Si terminated, that is to say rich in silicon, and having 3×2 surface reconstruction.

Figure 4:
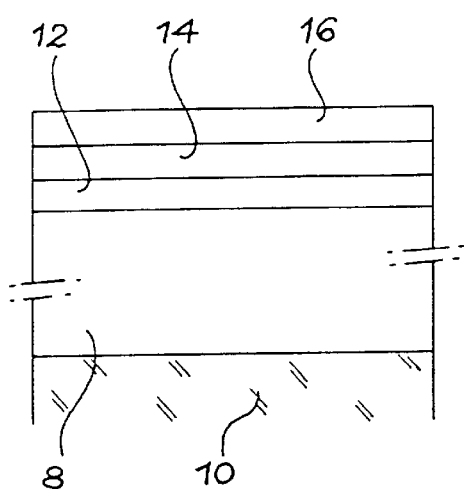
FIG. 4 is a schematic view in section of a surface of β-Sic (100), Si terminated and 3×2 reconstructed.

FIG. 4 is a schematic cross-sectional view of the β-SiC (100) substrate whose surface is Si terminated and 3×2 reconstructed.

In this FIG. 4, the very thin film of monocrystalline silicon carbide 8 can be seen, formed on a wafer 10 of Si (100).

The surface of this substrate 8 is formed by a unilayer of carbon 12.

This unilayer of carbon 12 is itself covered with a unilayer of silicon 14.

This unilayer of silicon 14 is covered with a depopulated unilayer 16 of silicon atoms, which constitutes a third of a silicon unilayer.

Figure 5:
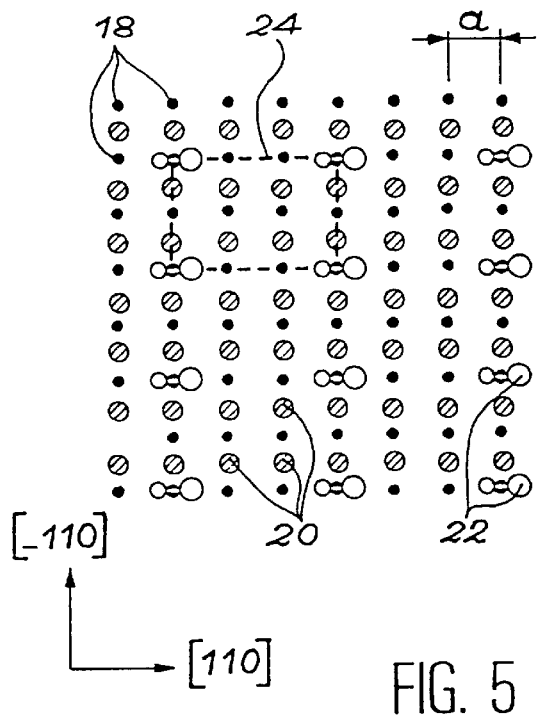
FIG. 5 is a schematic plan view of FIG. 4.

FIG. 5 is a plan view of the substrate provided with unilayers 12 and 14 and the depopulated unilayer 16.

The arrangement of the carbon atoms 18 of the layer 12 can be seen, above which the silicon atoms 20 of the silicon unilayer 14 are situated.

Asymmetric Si—Si dimers referenced 22 can also be seen, all these dimers 32 constituting the depopulated silicon unilayer 16.

In this layer 16, which constitutes the top layer of the substrate, the asymmetric dimers 22 all have the same angle of inclination and it can be seen clearly that the rows of dimers are perpendicular to the direction of the dimers.

For each dimer 22, the top silicon atom is depicted with a circle larger than that of the bottom atom of the silicon.

In FIG. 5, the rectangle 24 in dotted lines represents the elementary mesh of the 3×2 reconstructed surface.

The distance a is equal to $a_0/\sqrt{2}$, $a_0$ being the mesh parameter of β-SiC by volume.

The directions [110] and [−110] of the β-SiC (100) have also been noted.

Figure 6:
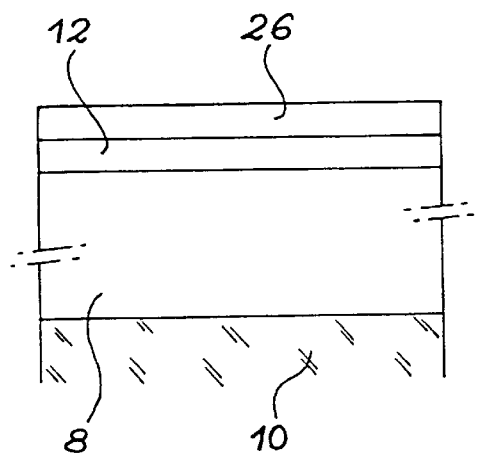
FIG. 6 is a schematic view in section of a surface of β-SiC (100), c terminated (4×2)

FIG. 6 is a schematic cross-sectional view of the substrate, whose surface is c(4×2) reconstructed, this reconstruction being obtained by annealing the substrate of FIG. 4.

The silicon wafer 10, the silicon carbide film 8 and the carbon unilayer 12 can also be seen.

In addition a silicon unilayer 26 can be seen, which is a rearrangement of the unilayer 14 of FIG. 4, the depopulated unilayer 16 having disappeared.

Figure 7:
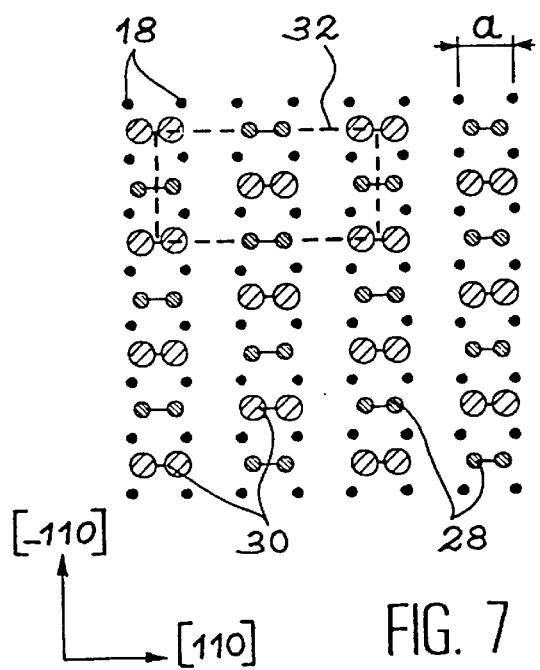
FIG. 7 is a schematic plan view of FIG. 6, FIGS. 8 and 9 are schematic views in section of surfaces of β-SiC (100), Si terminated and n×2 reconstructed, n being an odd number greater than 3.

FIG. 7 is a plan view of the substrate provided with these layers 12 and 26.

In addition, in FIG. 7, the atoms 18 of the carbon unilayer 12 can be seen.

The atoms of the silicon unilayer 26 can also be seen.

These atoms also form Si—Si dimers.

The lower Si—Si dimers can be seen, which are referenced 28, and the upper Si—Si dimers which are referenced 30 and depicted by larger circles than those of the lower dimers.

In FIG. 7, the rectangle in dotted lines 32 depicts the elementary mesh of the c(4×2) reconstructed surface of β-SiC (100).

Figure 8:
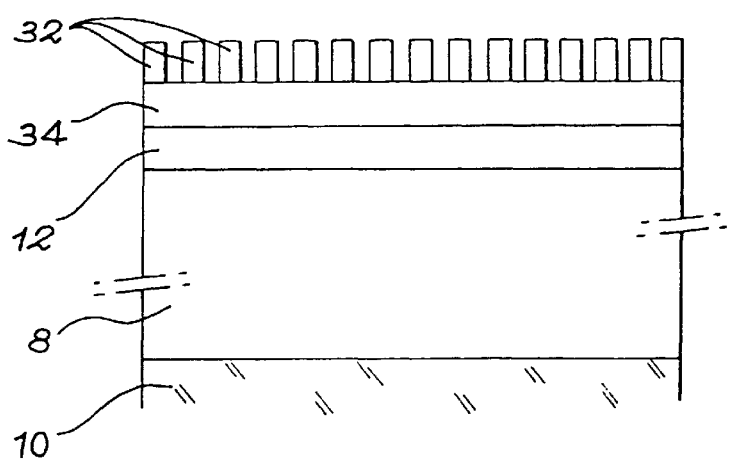

FIG. 8 is a schematic cross-sectional view illustrating an intermediate phase between the phases of FIGS. 4 and 6.

This intermediate phase corresponds to a reconstruction of type n×2, where n is an odd number greater than 3 and for example equal to 5.

The intermediate phase of FIG. 8 is obtained by annealing the structure of FIG. 4 and carries, at its top surface, atomic wires 32 according to the invention.

These result from a modification of the depopulated unilayer 16 of FIG. 4, a modification which is due to the annealing.

FIG. 8 also shows a silicon unilayer 34 resulting from a reorganisation of the layer 14 of FIG. 4 under the effect of the annealing.

Figure 9:
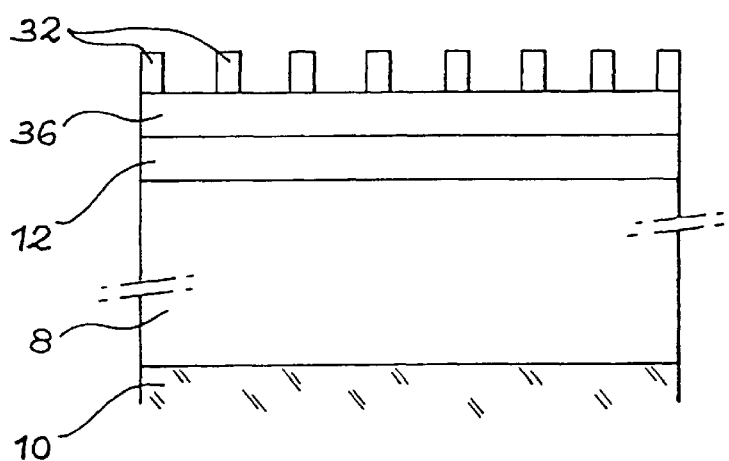

This phase depicted in FIG. 8 is followed by an annealing and another intermediate phase (also corresponding to a reconstruction of type n×2 where n is for example equal to 7) where the atomic wires 32 are more spaced apart from each other, as illustrated schematically in FIG. 9.

FIG. 9 also shows a silicon unilayer 36 which results from a reorganisation of the layer 34 in FIG. 8 under the effect of the annealing.

It should be noted that a supplementary annealing gives a change from the structure depicted in FIG. 9 to the structure depicted in FIG. 6.

The present invention is not limited to silicon atomic wires.

It also concerns carbon atomic wires, formed by arrangements of C—C dimers.

Such carbon atomic wires can be obtained by using an approach identical to that used for silicon wires.

The atomic wires which are the object of the invention have many applications.

It should be stated first of all that silicon carbide is a very interesting IV—IV semiconductor compound.

This is because this material has many practical applications in microelectronics (for high frequencies, high temperatures, high voltages and high powers) and in opto-electronics.

In addition, because of its high thermal and chemical stability, silicon carbide is a very attractive material for operating in hostile environments of the type encountered in aeronautics, in the space industry, the automobile industry and the petroleum industry, in geophysics and in nuclear reactors.

In addition, silicon carbide is a ceramic which has very interesting mechanical properties, such as for example great hardness, and it is one of the best bicompatible materials, notably with blood cells.

A first application of the atomic wires which are the object of the invention is indicated first of all.

Lattices of atomic wires in accordance with the invention can be used as matrices for manufacturing analogous lattices of metallic, magnetic or polymeric wires.

To do this, a metallic, magnetic, polymeric, organic, semiconducting, insulating or biological material is deposited on a substrate carrying a lattice of atomic wires according to the invention in order to obtain an analogous network of metallic, magnetic, polymeric, organic, semconducting, insulating or biological wires.

The invention also finds applications in electronics.

The search for miniaturisation in electronics has lead to the manufacture of smaller and smaller elementary devices, which can be as small as 0.2 µm or 0.3 µm.

However, by virtue of the new methods for the individual manipulation of atoms and molecules, it can now be envisaged constructing even smaller devices, whose size can range from 0.1 nm to 10 nm.

In this field, attempts are made to produce elementary functions for electronics with nano-objects having this size.

One problem which is difficult to solve concerns the addressing of these nano-objects.

This addressing requires wires with a thickness which is also very small, around 0.1 nm to 10 nm, and must be able to be effected in parallel over a very large number (which may range up to several millions) of nano-objects.

The invention makes it possible to solve this problem by means of a lattice of atomic wires obtained for example on β-SiC (100), this lattice of atomic wires constituting in some way a printed circuit on a nanometric scale.

The distance between the atomic wires can be adjusted as from approximately 1 nm.

Figure 10:
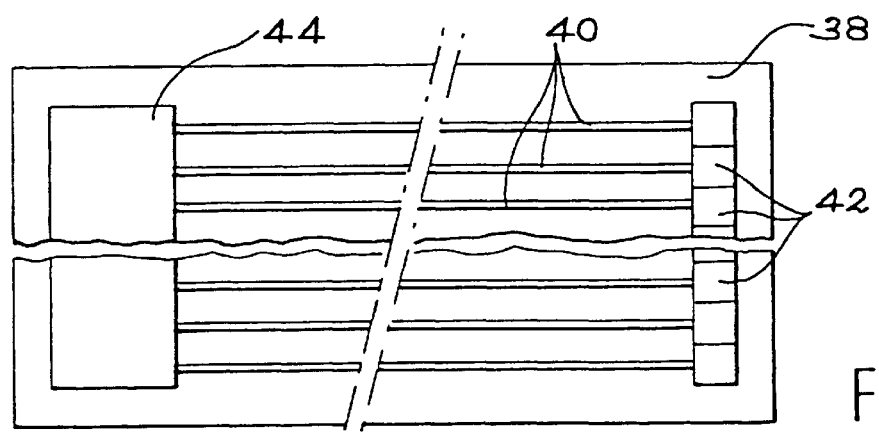
FIG. 10 illustrates schematically an application of the invention to the parallel addressing of nano-objects.

FIG. 10 illustrates schematically the parallel addressing mentioned above.

In this FIG. 10 a substrate 38 can be seen on which parallel atomic wires 40 are formed in accordance with the invention.

These wires 40 allow the parallel addressing of nano-electronic devices 42 which are formed on the substrate 38.

A microelectronic device 44, also formed on this substrate 38, sends control signals to the devices 42 by means of the wires 40.

It can also be mentioned that the silicon atomic wires formed on a surface of β-SiC (100) in accordance with the invention are also of interest in the production of electron locks.

The grafting, on atomic wires according to the invention or between these wires, of metal atoms or oxygen atoms for passivation or organic or inorganic molecules can also be envisaged.

Cutting in a controlled fashion, with the tip of a tunnel-effect microscope, pieces of atomic wires according to the invention can also be envisaged, for flexibly providing the connections between the different nano-objects.

The invention also finds applications in optics.

The invention makes it possible to produce a nanometric electromagnetic field lattice having the same geometric characteristics (lengths and distances between lines) as a lattice of atomic wires according to the invention.

This is because the illumination of this lattice with an appropriate light beam is capable, locally, close to the surface where this lattice is situated, of producing an entirely original near electromagnetic field distribution, adopting the same spatial distribution as the atomic wires.

This nanometric electromagnetic field lattice has applications in the laser-assisted deposition of atomic nanostructures on a surface.

The invention also finds applications in the field of the micromechanics.

The tribological properties of surfaces carrying wires according to the invention are very anisotropic, which makes them useful in micromechanical devices entailing movements.

The documents cited in the present description are as follows:

(1) H Roder, R Hahn, H Brune, J P Bucker et K Kern, Nature 366, 141 (1993).
(2) S Gunther et al, Phys. Rev. Lett. 73, 553 (1994).
(3) H Itoh, J Itoh, A Schmid et T Ichinokawa, Phys. Rev. B 48, 14663 (1993).
(4) J A Yoshikawa, J Nogami, C F Quate et P Pianetta, Surf. Sci. 321, 2183 (1994).
(5) Y W Mo, J Klein, M B Webb et M G Lagally, Surf. Sci. 268, 275 (1992).
(6) T C Shen, C Wang, G L Abeln, J R Tucker, J W Lyding, Ph. Avouris et R E Walkup, Science 268, 1590 (1995).
(7) R Kaplan et V M Bermudez, in *Properties of Silicon Carbide*, G Harris Editor, EMIS Datareview Series, INSPEC (London), Vol. 13, 101 (1995).
(8) F Semond, P Soukiassian, A Mayne, G Dujardin, L Douillard et C Jaussaud, Phys. Rev. Lett. 77, 2013 (1996).
(9) M Riehl-Chudoba, P Soukiassian et C Jaussaud, J. Appl. Phys. 76, 1332 (1994).
(10) M Riehl-Chudoba, S Dupont et P Soukiassian, Surf. Sci 331–333, 625 (1995).
(11) M Riehl-Chudoba, P Soukiassian, C Jaussaud et S Dupont, Phys. Rev. B 51, 14300 (1995).

What is claimed is:

1. A set of N atomic wires, wherein N is an integer equal to at least 1, wherein said wires are formed on the surface of an SiC substrate and comprise straight chains of dimers of an element selected from Si and C, said chains all running in the same direction parallel to each other and substantially equidistant from each other, and extending from one end of the substrate to another, said chains running perpendicular to the direction of the dimers.

2. A set of N atomic wires according to claim 1, wherein said surface is a Si-terminated β-SiC (100) surface, and said chains are chains of Si—Si dimers.

3. A set of N atomic wires according to claim 1, wherein said surface is a C-terminated β-SiC (100) surface, and said chains are chains of C—C dimers.

4. A method of manufacturing the set of N atomic wires according to claim 1, wherein layers of said element are formed on said surface, said set being formed by annealing the surface provided with said layers, the last annealing eliminating progressively from the surface, selectively, rows of dimers of said element so as to produce said set of N atomic wires.

5. A method according to claim 4, wherein the temperature and duration of the last of the annealings are controlled so as to obtain a required number N of atomic wires over a given distance, counted perpendicularly to the wires.

6. A method according to claim 4, wherein the said set is constructed in a chamber maintained at a pressure below $5 \times 10^{-9}$ Pa or in a neutral atmosphere.

7. A method according to claim 4, wherein a monocrystalline substrate of SiC in β-SiC (100) cubic phase is formed, the resulting substrate is transformed so that its surface is Si terminated and 3×2 unit cell reconstructed and the substrate thus transformed is annealed at a temperature in the range from 1000° C. to 1150° C. so as to progressively eliminate rows of Si—Si dimers from this surface by selective desorption and to obtain said set of N atomic wires.

8. A method according to claim 7, wherein the substrate thus transformed is annealed for 5 minutes to 10 minutes.

9. A method according to claim 7, wherein the monocrystalline substrate is obtained by chemical vapour deposition of a first gaseous compound containing carbon and a second gaseous compound containing silicon on a vicinal surface of Si (100) deorientated by 4°.

10. A method according to claim 9, wherein the first gaseous compound is $C_3H_8$ and the second gaseous compound is $SiH_4$.

11. A method according to claim 9, wherein the monocrystalline substrate is annealed so that its surface becomes a surface with a carbon-rich 1×1 unit cell structure, layers of silicon are deposited on this surface at room temperature, and thereafter the substrate provided with said deposited silicon layers is annealed at approximately 1000° in order to produce a surface of Si-terminated and 3×2 unit cell reconstructed β-SiC (100).

12. Application of the set of N atomic wires according to claim 1 to the manufacture of a set of wires of a metallic, magnetic, polymeric, organic or semiconducting material, using said set of N atomic wires as a matrix receiving a deposit of the said material.

13. Application of the set of N atomic wires according to claim 1 to the parallel addressing of electronic devices whose size is around 0.1 nm to 10 nm, the atomic wires having a thickness of around 0.1 nm to 10 nm.

14. Application of the set of N atomic wires according to claim 1 to the manufacture of a set of wires of an insulating or biological material, using said set of N atomic wires as a matrix receiving a deposit of the said material.

* * * * *